United States Patent [19]

Hannington

[11] Patent Number: 4,654,549
[45] Date of Patent: Mar. 31, 1987

[54] TRANSISTOR-TRANSISTOR LOGIC TO EMITTER COUPLED LOGIC TRANSLATOR

[75] Inventor: Geoff Hannington, South Portland, Me.

[73] Assignee: Fairchild Semiconductor Corporation, Palo Alto, Calif.

[21] Appl. No.: 741,007

[22] Filed: Jun. 4, 1985

[51] Int. Cl.[4] ............... H03K 19/003; H03K 19/092; H03K 17/60; H03K 17/04
[52] U.S. Cl. ........................... 307/475; 307/443; 307/456; 307/473
[58] Field of Search .............................. 307/454–456, 307/443, 445, 467, 475, 355, 356, 358, 360, 264, 270, 473

[56] References Cited

U.S. PATENT DOCUMENTS

| | | | |
|---|---|---|---|
| 3,770,986 | 11/1973 | Drehle | 307/270 |
| 4,255,670 | 3/1981 | Griffith | 307/473 |
| 4,287,433 | 9/1981 | Goodspeed | 307/473 |
| 4,311,927 | 1/1982 | Ferris | 307/473 |
| 4,321,490 | 3/1982 | Bechdolt | 307/456 |
| 4,330,723 | 5/1982 | Griffith | 307/456 |
| 4,518,876 | 5/1985 | Constantinescu | 307/475 |
| 4,527,078 | 7/1985 | Smith | 307/475 |
| 4,527,079 | 7/1985 | Thompson | 307/475 |
| 4,533,842 | 8/1985 | Yang et al. | 307/475 |
| 4,585,959 | 4/1986 | Baskett et al. | 307/473 |
| 4,599,521 | 7/1986 | Kanai et al. | 307/475 X |

FOREIGN PATENT DOCUMENTS

| | | | |
|---|---|---|---|
| 0009083 | 4/1983 | European Pat. Off. | 307/475 |
| 0004331 | 1/1985 | Japan | 307/475 |
| 0130211 | 7/1985 | Japan | 307/443 |

OTHER PUBLICATIONS

F100K ECL User's Handbook, 1982, Fairchild Camera & Instrument Corp., Advanced Bi—Polar Div., Chapter 2, "Circuit Basics".
F100K ECL Data Book,—Fairchild Camera & Instrument Corp., Advanced Bi—Polar Div., Chapter 1, "Family Overview".

Primary Examiner—Stanley D. Miller
Assistant Examiner—David R. Bertelson
Attorney, Agent, or Firm—Kenneth Olsen; David H. Carroll; Daniel H. Kane, Jr.

[57] ABSTRACT

A transistor-transistor logic (TTL) to emitter coupled logic (ECL) translator includes a TTL input gate for receiving TTL voltage level logic input signals in the positive voltage range compatible with TTL circuits and an ECL output gate for delivering corresponding ECL voltage level logic output signals in the negative voltage range compatible with ECL circuits. A translating current source operatively coupled between the TTL input gate and ECL output gate translates signals down to the negative ECL voltage range for application to the input transistor of the ECL output gate. A bidirectional bridge clamp also operatively coupled between the TTL input gate and ECL output gate limits the swing of the translated signals in the negative voltage range applied at the input of the ECL output gate thereby reducing propagation delay across the translator and reducing power dissipation.

19 Claims, 4 Drawing Figures

4,654,549

TRANSISTOR-TRANSISTOR LOGIC TO EMITTER COUPLED LOGIC TRANSLATOR

TECHNICAL FIELD

This invention relates to transistor-transistor logic (TTL) to emitter coupled logic (ECL) translators for receiving TTL voltage level logic input signals compatible with TTL circuits and for delivering corresponding ECL voltage level logic output signals compatible with ECL circuits.

BACKGROUND ART

In currently used transistor-transistor logic (TTL) devices and circuits, logical values corresponding to binary "1" and "0" are ordinarily represented at the output by a high level voltage for example in the range of 2.5 to 5 volts and a low level voltage for example in the range of 0 to 0.8 volts. Such TTL output devices and circuits are described for example in U.S. Pat. No. 4,255,670 for "Transistor Logic Tristate Output With Feedback"; U.S. Pat. No. 4,287,433 for "Transistor Logic Tristate Output With Reduced Power Dissipation"; U.S. Pat. No. 4,311,927 for "Transistor Logic Tristate Device With Reduced Output Capacitance"; U.S. Pat. No. 4,321,490 for "Transistor Logic Output For Reduced Power Consumption and Increased Speed During Low to High Transition"; and U.S. Pat. No. 4,330,723 for "Transistor Logic Output Device For Diversion of Miller Current". Overall the TTL family of logic circuits including the low power Schottky TTL circuits and the Fairchild Advanced Schottky TTL circuits provide a combination of relatively short propagation delays with relatively low power dissipation.

On the other hand, emitter coupled logic (ECL) circuits and devices which provide higher speed switches, generally operate at negative voltage with the high and low level voltage signals established on either side of a negative reference voltage typically in the range of $-1.2$ to $-2.0$ volts. For example with a reference voltage of $-1.2$ volts, the high level voltage signal is in the range of for example $-0.8$ volts while the low level voltage signal is in the range of $-1.6$ volts. For a reference voltage of $-2.0$ volts, the high level voltage signals may be in the order for example of $-1.6$ volts with the low level voltage signals in the order of for example $-2.4$ volts.

The typical TTL output device or TTL internal buffer circuit includes a pull-up transistor element comprising a Darlington transistor pair for sourcing current to the output of the circuit from a high potential source $V_{cc}$, typically 5 volts $+0.5$ volts for providing high level voltage signals. A pull-down transistor element sinks current from the circuit output to low potential typically ground or 0 volts for establishing low level voltage signals at the output. The phase splitter transistor element controls the respective states of the pull-up and pull-down transistor elements in response to data signals at the TTL circuit input.

On the other hand, the typical ECL gate or circuit includes a pair of transistors with common emitter coupling providing alternative transistor collector paths from a high level voltage or high potential at ground or 0 volts. The transistors are operatively coupled for switching current between the collector paths according to input signals at the base of one of the transistors. An ECL current source is coupled between the common emitter coupling and a negative voltage such as $-5$ volts $+0.5$ volts for generating current in the alternate transistor collector paths.

One of the ECL gate transistors is selected to be the input signal transistor for receiving ECL input data signals at the base of the input signal transistor. The other transistor constitutes a reference transistor and the negative reference voltage signal typically in the range of $-1.2$ to $-2$ volts applied to the base of the reference transistor establishes the relative location of high and low level signals in the negative voltage range. The output of the ECL gate or circuit is obtained from the collector nodes of the ECL transistor pair typically through emitter follower buffer transistors which provide current gain and shift the voltage levels. A feature and advantage of the ECL gate or circuit is that complementary output signals are available from the collector nodes. Furthermore, the input signal transistor may comprise multiple parallel transistors for multiple inputs or transistors arranged to provide desired logic functions and combinations. Further description of ECL gates and circuits can be found, for example, in the *F100K ECL USER'S HANDBOOK*, Copyright 1982, Fairchild Camera and Instrument Corporation, Advanced Bi-polar Division, 441 Whisman Road, Mountain View, California 94042, Chapter 2, "Circuit Basics", and the *F100K ECL DATA BOOK*, Chapter 1, 37 Family Overview", by the same publisher.

To obtain the advantages of both TTL and ECL circuits, gates, internal buffers and output devices, translators are required for translating the logic data signals from the voltage levels of one logic circuit family to voltage levels compatible with the other. Such a TTL to ECL translator according to the prior art is illustrated in FIG. 1. Generally, the conventional TTL to ECL translator 10 comprises an ECL input gate G1, operating however at positive TTL voltage levels, for receiving TTL voltage level logic input signals TTL $V_{in}$ at the input 12 compatible with TTL circuits. An ECL output gate G2 operating in the ECL negative voltage range delivers corresponding ECL voltage level logic output signals ECL $V_{out}$ at the complementary outputs 14 and 14c compatible with ECL circuits.

The ECL input gate G1 operating in the positive TTL voltage range includes a pair of transistors Q1 and Q2, with common emitter coupling 15, providing alternate transistor collector paths 16 and 18. ECL current source I1 generates the switching source current through either of the alternate collector paths 16 and 18 according to the conducting state of transistors Q1 and Q2. The conducting state of transistors Q1 and Q2 is controlled by input signals TTL $V_{in}$ in the positive TTL voltage range applied to the base of transistor Q1 at input 12.

ECL input gate G1 operates in the positive TTL voltage range between the high level voltage source $V_{cc}$ which may be for example $+5$ volts $+0.5$ volts and ground potential at node 20. The ECL current source I1 is connected between the common emitter node 15 and ground or low level potential node 20 and along with collector resistor RL determines the differential range or swing between high and low level logic signals in the TTL positive voltage range at the output of ECL input gate G1 which are applied to the base of emitter follower buffer transistor Q5. The positive reference voltage threshold and relative location of high and low level signals in the positive TTL voltage range is set by the base collector shorted (BCS) transistors Q3 and Q4 and reference resistor $R_{ref}$ coupled to the base of reference transistor Q2.

To provide translation down of the TTL voltage level logic input signals to ECL voltage levels a translating current source I2 and translating resistor R1 are provided at the output from ECL gate G1 and emitter follower buffer transistor Q5. The output signals from ECL input gate G1 and buffer transistor Q5 are translated down to the desired ECL negative voltage range by the selected value of the translating resistor R1 and the magnitude of current I2. Generally, an ECL output gate or stage G2 is provided to restore the edge rate of the translated ECL negative voltage level logic signals and provide higher power drive capability.

The ECL output gate G2 operates in the negative ECL voltage range between high level ground potential coupled at node 21 and low level voltage source $V_{ee}$ selected, for example, typically at $-5$ volts $+0.5$ volts. ECL output gate G2 is formed by the transistor pair Q6 and Q7 providing alternate collector paths through collector resistors RL1 and RL2 respectively. The ECL output gate current source I3 is coupled between the common emitter nodes 17 of ECL output gate G2 and low level voltage source $V_{ee}$ to provide the source current for switching between the alternate collector paths.

Transistor Q6 is the input transistor of ECL gate G2 and the translated signals are applied to the base of transistor Q6 for switching the source current I3 between the alternate transistor collector paths providing complementary ECL voltage level logic output signals at the complementary outputs 14 and 14c. With a high level or logic 1 TTL input signal TTL $V_{in}$ in the positive voltage range applied to the input 12 of ECL input gate G1, a high level or logic 1 ECL output signal ECL $V_{out}$ in the ECL negative voltage range appears at the "True" output 14 of ECL output gate G2 while a low level or logic 0 ECL signal in the ECL negative voltage range appears at the "False" output 14c of ECL output gate G2. Conversely, a low level or logic 0 input signal in the positive TTL voltage range at input 12 of ECL input gate G1 produces a low level or logic 0 ECL output signal in the negative ECL voltage range at the "True" output 14 of ECL output gate G2 while a high level or logic 1 ECL output signal appears at the "False" output 14c.

To reduce power consumption the translating current source and translating current I2 must be small in value while the translating resistor R1 is large. The time constant at the junction of R1 and I2 which is determined by the value of R1 and the capacitance at this junction is therefore also large. A relatively long rise and fall time between high and low level logic signals therefore results at this junction. Furthermore, the logic signal voltage swing in the TTL voltage range at ECL input gate G1 must be made large so that upon translation down to the ECL negative voltage range, there is sufficient range between the ECL high and low level voltage signals on either side of the reference voltage $V_{ref}$ so that the ECL output gate G2 can operate for all possible variations of the voltage source $V_{cc}$. The combination of large time constant in the translation current path and large logic signal voltage swing in the ECL gates results in an undesirably long propagation delay across the conventional TTL to ECL translator.

OBJECTS OF THE INVENTION

It is therefore an object of the present invention to provide an improved TTL to ECL translator with greater switching speed and reduced propagation delay across the translator.

Another object of the invention is to provide an improved TTL to ECL translator which eliminates the translating resistor and consequent large time constant in the translation current path.

A further object of the invention is to provide an improved TTL to ECL translator with restricted logic signal voltage swing in the translator gates.

DISCLOSURE OF THE INVENTION

In order to accomplish these results the present invention provides a TTL to ECL translator having a TTL input gate for receiving TTL voltage level logic input signals in the positive voltage range compatible with TTL circuits. The translator includes an ECL output gate for delivering corresponding ECL voltage level logic output signals in the negative voltage range compatible with ECL circuits. A translating current source is operatively coupled between the TTL input gate and the ECL output gate for translating and applying ECL voltage level signals to the base of the input transistor of the ECL output gate corresponding to the TTL input signals.

According to the invention, a clamp is operatively coupled between the TTL input gate and ECL output gate for limiting the swing and reducing the propagation delay of the translated signals in the negative voltage range applied by the translating current source at the input transistor of the ECL output gate. Another feature and advantage of the clamp according to the present invention is that the prior art translating resistor and accompanying large time constant is eliminated, further reducing propagation delay across the translator.

In the preferred embodiment of the invention the clamp is a bidirectional clamping bridge having an input node coupled to the output of the TTL input gate, an output node coupled to the input of the ECL output gate, a ground node coupled to ground potential, and a floating node. The output node of the clamp bridge is coupled to the base of the input transistor of the ECL output gate so that the translated signals are applied by the translating current source through the bidirectional bridge clamp. The bridge clamp provides both a high voltage clamp and a low voltage clamp limiting the logic signal differential or voltage swing applied to the ECL output gate. The reference voltage setting the threshold of the ECL output gate may be established through a diode coupling of the base of the reference transistor to the ground node.

The bridge clamp itself may comprise first and second diodes coupled on either side of the floating node between the bridge input and output nodes, and third and fourth diode junctions coupled on either side of the ground node between the input and output nodes. In the preferred example embodiment the third and fourth diode junctions are provided by base collector shorted (BCS) transistors while the first and second diodes are Schottky diodes. The base emitter junctions of the BCS transistors are small in area relative to the diode junctions of the Schottky diodes providing a larger voltage drop across the BCS transistors than the diodes. This affords sufficient logic signal voltage swing about the reference voltage of the ECL output gate to afford practical noise immunity. At the same time, however, the logic signal voltage swing is limited by the bidirectional clamp to enhance speed and reduce propagation delay.

Other objects, features, and advantages of the invention are apparent in the following specification and accompanying drawings.

BRIEF DESCRIPTION OF THE DRAWINGS

FIG. 3 is a detailed diagram of the preferred embodiment of the bridge clamp while

DESCRIPTION OF PREFERRED EXAMPLE EMBODIMENTS AND BEST MODE OF THE INVENTION

Figure 2:
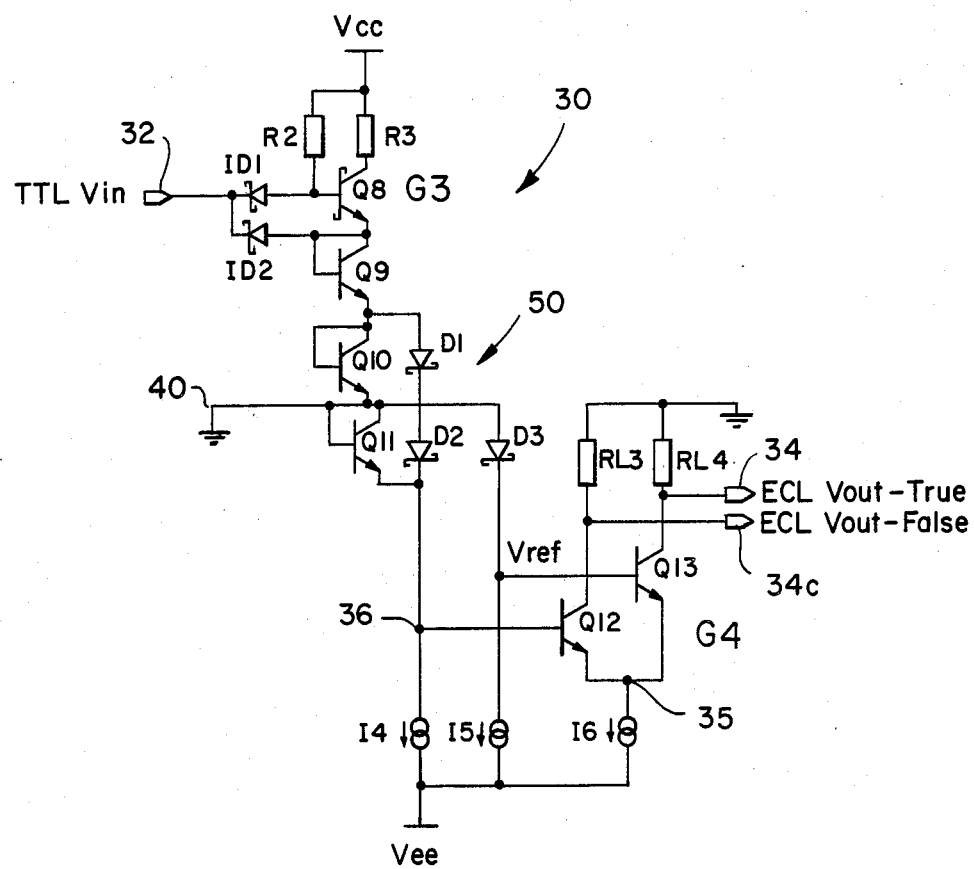
FIG. 2 is a schematic diagram of the improved TTL to ECL translator according to the present invention.

An improved TTL to ECL translator 30 according to the present invention is illustrated in FIG. 2. According to the invention the improved translator 30, unlike the prior art translator 10, provides for the input gate a TTL input gate G3 operating in the TTL positive voltage range. The TTL input gate G3 includes the translator input 32 for receiving TTL voltage level logic input signals TTL $V_{in}$, input diodes ID1 and ID2, TTL transistor element Q8 with emitter follower transistor Q9 providing the output of the TTL input gate, and resistors R2 and R3 coupling the TTL input gate to high level voltage source $V_{cc}$ which may be, for example 5 volts ±.5 volts.

Figure 1:
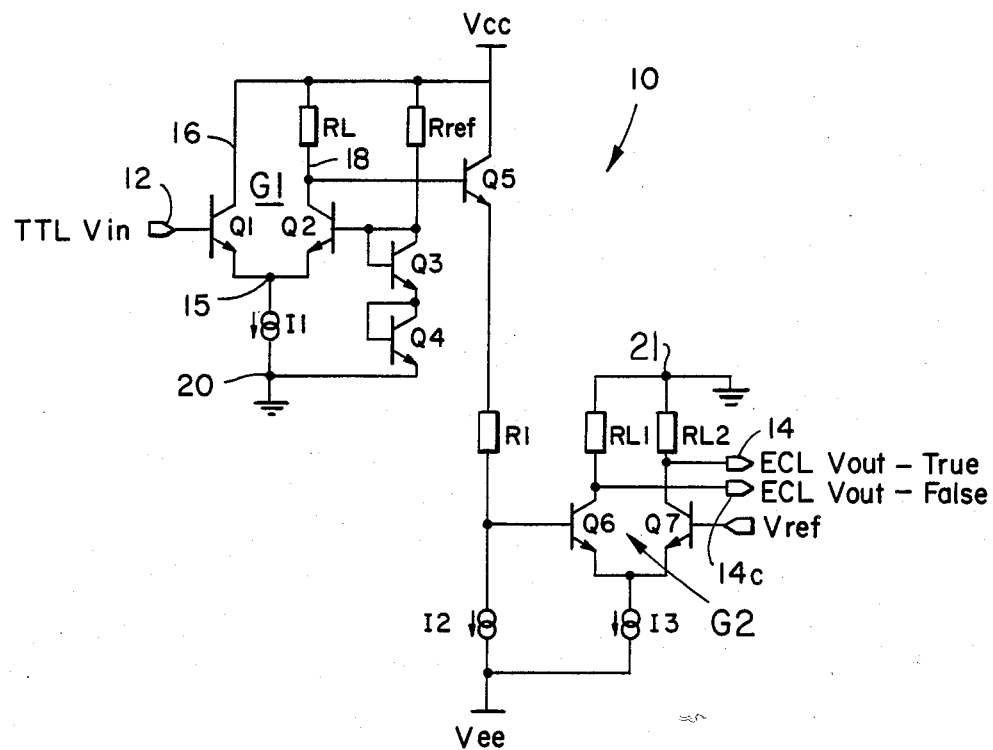
FIG. 1 is a schematic diagram of a prior art TTL to ECL translator.

The output of translator 30 is provided by ECL output gate G4 similar to the ECL output gate or buffer G2 used in the translator 10 of FIG. 1. ECL output gate G4 includes the input transistor Q12 and reference transistor Q13 which provide alternate collector current paths for the source current generated by current source I6 coupled between the common emitter node 35 and the ECL low level voltage source $V_{ee}$ which may be, for example, −5 volts ±.5 volts. The outputs of ECL output gate G4 from the voltage drops across collector resistors RL3 and RL4 provide ECL low level voltage logic output signals ECL $V_{out}$−True and ECL $V_{out}$−False at the complementary outputs 34 and 34c. The reference voltage $V_{ref}$ applied to the base of reference transistor Q13 is established by current source I5 and Schottky diode D3 coupled between the ground potential node 40 and low level voltage source $V_{ee}$. Thus the reference voltage $V_{ref}$ which establishes the negative voltage level of the ECL gate switching threshold is set at $-V_{sd}$ potential and differs in this respect from the ECL output gate G2 of prior art translator 10 shown in FIG. 1.

Translation of input signals applied to the input 32 of translator 30 from the TTL positive voltage range to the ECL negative voltage range is effected by the translation current source I4 and bidirectional clamp 50 that limits the logic voltage swing or difference applied to the base node input 36 of the ECL buffer G4. A feature and advantage of the translator circuit according to the present invention is that the level shifting or translating resistor R1 of the prior art translator 10 of FIG. 1 along with the large time constant which accompanies it is eliminated.

Figure 3:
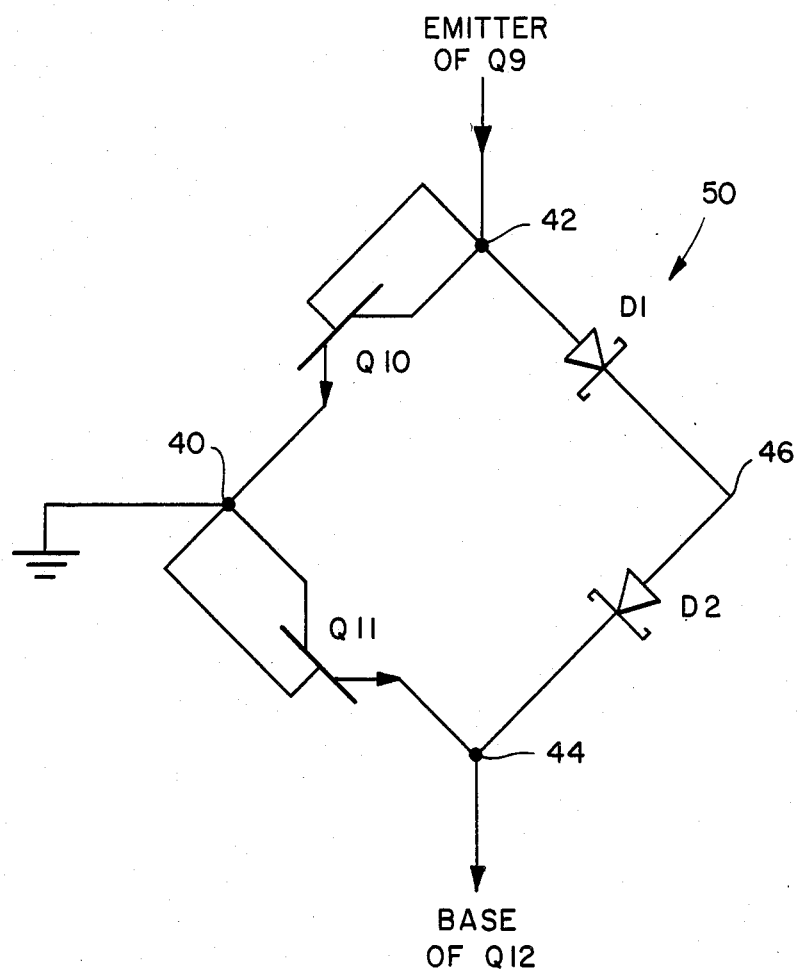
Figure 3A:
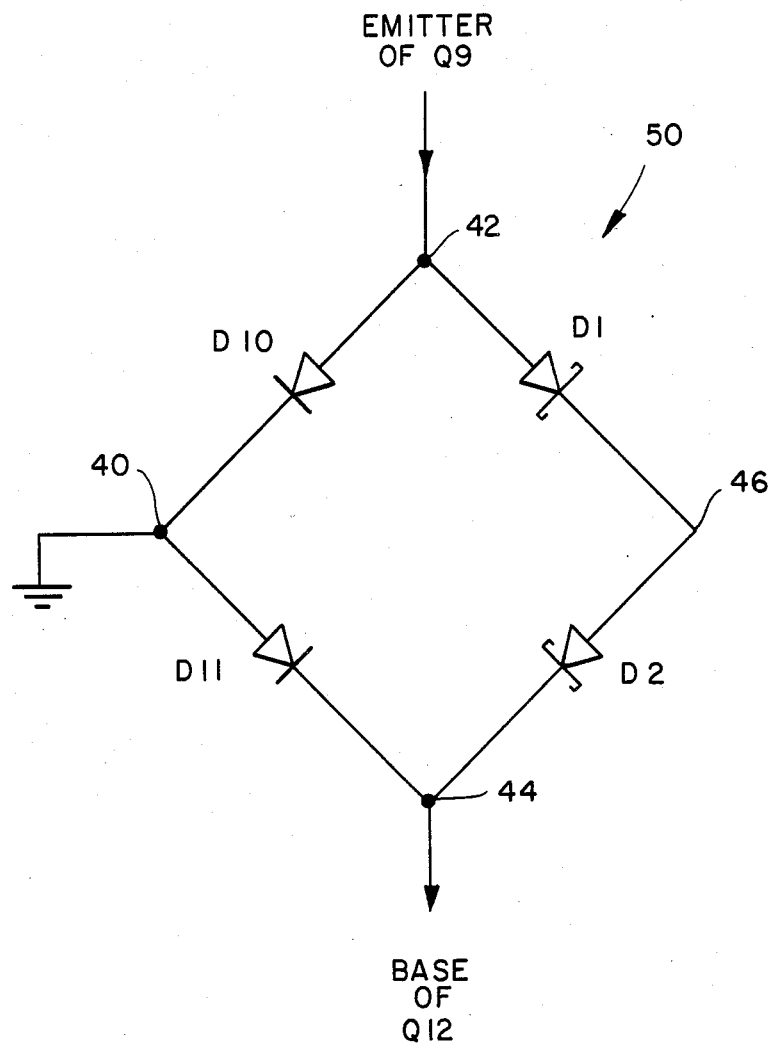
FIG. 3A is a detailed diagram of an equivalent circuit of the clamp bridge.

The bidirectional clamp 50 comprises a clamp bridge shown in separate detail in FIG. 3. The clamp bridge circuit includes an input node 42 coupled to the output of TTL input gate G3, an output node 44 coupled to the input of ECL output gate G4, a ground node 40, and a floating node 46 otherwise unconnected to other elements of the translator circuit. The bridge components are provided by Schottky diodes D1 and D2 coupled on either side of the floating node 46 between the bridge input and output nodes 42 and 44, and the BCS transistors Q10 and Q11 coupled on either side of the ground node 40 between the input and output nodes 42 and 44. An equivalent circuit of the clamp bridge 50 is shown in FIG. 3A with the common elements designated by the same reference numerals. The BCS transistors Q10 and Q11 function as effective diodes D10 and D11 with voltage drops across the diode junction equal to $V_{be}$ where $V_{be}$ is the potential drop across the base emitter junction of the BCS transistor.

As a result of this configuration the bridge clamp 50 constrains the logic voltage swing on either side of the reference voltage $V_{ref}$ to a small value equal to the difference between the forward bias potential drop across one of the BCS transistors and the forward bias potential drop across one of the Schottky diodes. Thus, the logic swing about the reference voltage $V_{ref}$ is equal to $\pm(V_{fwdBCS} - V_{fwdsd})$ or more simply $\pm(V_{be} - V_{sd})$ on either side of the reference voltage $V_{ref}$. The base emitter junctions of BCS transistors Q10 and Q11 are made small in area relative to the diode junction across Schottky diodes D1 and D2 so that $V_{fwdBCS}$ or $V_{be}$ is large relative to $V_{fwdsd}$ or $V_{sd}$. The resulting voltage swing $\pm(V_{be} - V_{sd})$ therefore affords practical noise immunity in ECL output gate G4. As mentioned above, the reference voltage $V_{ref}$ is set at $-V_{fwdsd}$ or simply $-V_{sd}$ by reference diode D3 and reference current source I5.

Referring to FIGS. 2 and 3, when a low level logic 0 TTL input signal appears at the translator input 32, the TTL input gate transistors are deprived of base drive current and transistors Q8, Q9, and Q10 are not conducting. While transistors Q8, Q9, and Q10 are off, the translating current source I4 draws current from bridge BCS transistor Q11 which is conducting. Therefore a potential of $-V_{be}$ below ground is applied at the base of input transistor Q12 of the ECL output gate G4. Since the base of Q12 is therefore at a lower potential than the base of Q13 to which the reference voltage $V_{ref}$ equal to $-V_{sd}$ is applied, Q12 is off and reference transistor Q13 conducts source current through collector resistor RL4. A low level or logic 0 ECL output signal in the negative ECL voltage range appears at output 34. Conversely, a logic 1 or high level ECL logic signal appears at the complementary output 34c.

For a high level or logic 1 TTL input signal at the translator input 32, transistors Q8, Q9, and Q10 become conducting and a potential of $+1\ V_{be}$ above ground appears at the input node 42 of the bidirectional clamp 50 and diodes D1 and D2 conduct current. A potential is therefore applied at the base of the ECL gate input transistor Q12 of $+V_{be} - (V_{sd1} + V_{sd2})$ or $+V_{be} - 2 V_{sd}$. The base of input transistor Q12 is therefore at a higher voltage in the negative ECL voltage range than the base of reference transistor Q13 so that input transistor Q12 becomes conducting. With transistor Q13 not conducting, a high level or logic 1 ECL output signal appears at the ECL $V_{out}$−True output 34 while a low level or logic 0 ECL output signal appears at the complementary ECL $V_{out}$−False output 34c.

Referring to FIGS. 3 and 3A, the bidirectional bridge clamp 50 provides alternative clamps, a high voltage level clamp and a low voltage level clamp according to the logic input signals at the input 32. The alternative clamps limit the logic swing at the input to ECL output gate G4 at the base of input transistor Q12 while the reference voltage $V_{ref}$ is maintained at a limited potential of $-V_{sd}$. This limitation of the logic voltage swing to a small differential provides higher speed propagation of signals through the translator than can be achieved in the prior art translator 10 of FIG. 1, when the translation current source I4 is maintained at the same current level as current source I2 in the prior art translator 10. Alternatively, the current level in I4 can be substantially reduced over I2, while maintaining the propagation delay which occurs in prior art translator 10 of FIG. 1. The invention also eliminates translation resistor R1 and the accompanying large time constant. This is all accomplished by means of the intermediate bidirectional bridge clamp 50 according to the present invention.

The operation of the high and low level clamps of the bridge 50 is as follows. When a high level or logic 1 TTL input signal appears at the translator input 32 and transistors Q8, Q9, and Q10 are conducting, a partially translated high level voltage signal appears at the input node 42 of the bidirectional clamp 50 and Schottky diodes D1 and D2 conduct current to the base of ECL gate input transistor Q12. In this mode the bidirectional clamp 50 operates as a high voltage clamp limiting the high level ECL voltage in the negative ECL voltage range which appears at the base of input transistor Q12. On the other hand, when a low level or logic 0 TTL input signal appears at the input 32 of translator 30 and transistors Q8, Q9, and Q10 are nonconducting, a partially translated relatively low level voltage signal appears at the input node 42 of bridge clamp 50. The BCS bridge transistor Q11 is conducting and the low level ECL voltage signal in the negative ECL voltage range appears at the base of input transistor Q12. In this mode the bidirectional bridge clamp 50 operates as a low voltage clamp limiting the negative swing of the logic voltage level applied at the base of transistor Q12.

The overall effect of the operation of the bidirectional clamp 50 is to reduce substantially the power delay product in the improved TTL to ECL translator 30 over the prior art translator 10 of FIG. 1. A further feature and advantage of the combination of the TTL input gate G3 and bidirectional bridge clamp 50 in the TTL to ECL translator 30 of the present invention as shown in FIG. 2 is that the TTL input voltages remain substantially within the normal threshold operating range and specifications for a TTL gate.

While the invention has been described with reference to particular example embodiments, it is intended to cover all modifications and equivalents within the scope of the following claims.

I claim:

1. An improved transistor-transistor logic (TTL) to emitter coupled logic (ECL) translator comprising:
   TTL input gate means for receiving TTL voltage level logic input signals in the positive voltage range compatible with TTL circuits;
   ECL output gate means for delivering corresponding ECL voltage level logic output signals in the negative voltage range compatible with ECL circuits, said ECL output gate comprising an input transistor and a reference transistor providing alternate input transistor and reference transistor collector current paths operatively coupled for switching current between the alternate current paths according to signals at the base of the input transistor;
   translating current source means operatively coupled between the TTL input gate means and the ECL output gate means for applying translated signals to the input transistor of the ECL output gate means in the negative voltage range according to the input signals at the TTL input gate means;
   and clamp means operatively coupled between the TTL input gate means and ECL output gate means for limiting the swing of said translated signals in the negative voltage range applied by the translating current source at the input transistor of the ECL output gate means thereby reducing propagation delay across the translator and reducing power dissipation.

2. The TTL to ECL translator of claim 1 wherein said clamp means comprises a bidirectional clamp.

3. The TTL to ECL translator of claim 2 wherein the bidirectional clamp comprises a clamp bridge, said bridge having an input node coupled to the TTL input gate means, an output node coupled to the ECL output gate means, a ground node coupled to ground potential, and a floating node.

4. The TTL to ECL translator of claim 3 wherein the input node of the clamp bridge is coupled to the output of the TTL input gate means, the output node of the clamp bridge is coupled to the base of the input transistor of the ECL output gate means, and the translating current source means is operatively coupled to the output node of the clamp bridge, said clamp bridge thereby limiting the voltage range of signals applied to the ECL input gate means by the translating current source means.

5. The TTL to ECL translator of claim 4 wherein the base of the reference transistor of the ECL output gate means is coupled through diode means to the ground node of the clamp bridge and wherein a reference current source is coupled to the base of said reference transistor for applying a reference voltage in the negative voltage range at the base of said reference transistor.

6. The TTL to ECL translator of claim 3 wherein said clamp bridge comprises first and second diode means coupled on either side of the floating node and first and second base collector shorted transistor means coupled on either side of the ground node.

7. The TTL to ECL translator of claim 3 wherein said clamp bridge comprises first and second diode junction means coupled on either side of the floating mode and third and fourth diode junction means coupled on either side of the ground node.

8. The TTL to ECL translator of claim 7 wherein the diode junction area of the third and fourth diode junction means is relatively smaller than the diode junction area of the first and second diode junction means so that the voltage drop across the first and second diode junction means is smaller than the voltage drop across the third and fourth diode junction means.

9. The TTL to ECL translator of claim 8 wherein the third and fourth diode junction means comprise base collector shorted transistors with base emitter junction areas relatively smaller than the diode junction areas of the first and second diode junction means.

10. An improved transistor-transistor logic (TTL) to emitter coupled logic (ECL) translator having input gate means for receiving TTL voltage level logic input signals in the positive voltage range compatible with TTL circuits, an ECL output gate means for delivering corresponding ECL voltage level logic output signals in the negative voltage range compatible with ECL circuits, said ECL output gate means comprising an input transistor and a reference transistor providing alternate collector current paths operatively coupled for switching current between the current paths according to signals at the base of the input transistor, and a translating current source operatively coupled between the input gate means and the ECL output gate means for applying translated signals in the negative voltage range to the base of the input transistor of the ECL output gate means according to the input signals at the input gate means, the improvement comprising:

said input gate means comprising a TTL input gate; and clamp means operatively coupled between the TTL input gate means and the ECL output gate means for limiting the range of translated signals in the negative voltage range applied by the translating current source at the base of the input transistor of the ECL output gate means thereby reducing propagation delay across the translator and reducing power dissipation.

11. The TTL to ECL translator of claim 10 wherein the clamp means comprises a bidirectional clamp bridge, said bridge having an input node coupled to the TTL input gate means, an output node coupled to the ECL output gate means, a ground node coupled to ground potential, and a floating node.

12. The TTL to ECL translator of claim 11 wherein the input node of the clamp bridge is coupled to the output of the TTL input gate means, wherein the output node of the clamp bridge is coupled to the base of the input transistor of the ECL output gate means, and wherein the translating current source is also coupled to the output node of the clamp bridge whereby translated signals applied to the base of said input transistor of the ECL output gate means are limited in voltage range by the clamp bridge.

13. The TTL to ECL translator of claim 12 wherein said bidirectional clamp bridge comprises first and second diode means coupled at either side of the floating node and third and fourth diode means coupled at either side of the ground node.

14. The TTL to ECL translator of claim 13 wherein the third and fourth diode means comprise base collector shorted transistors having base emitter junction areas smaller than the diode junction areas of the first and second diode means.

15. The TTL to ECL translator of claim 13 wherein the base of said reference transistor is coupled through reference diode means to said ground node and further comprising a reference current source for applying a reference voltage below ground potential at the base of said reference transistor.

16. An improved transistor-transistor logic (TTL) to emitter coupled logic (ECL) translator comprising:

TTL input gate means for receiving TTL voltage level logic input signals in the positive voltage range compatible with TTL circuits;

a translating current source operatively coupled between the output of the TTL input gate means and negative potential for generating translated ECL voltage level logic output signals compatible with ECL circuits corresponding to the input signals at the TTL input gate means;

and clamp means operatively coupled between the TTL input gate means and translating current source for limiting the range of said translated signals in the negative voltage range thereby reducing propagation delay across the translator and reducing power dissipation.

17. The TTL to ECL translator of claim 16 wherein the clamp means comprises a bidirectional clamp bridge, said bridge having an input node coupled to the output of the TTL input gate means, an output node coupled to the translating current source, a ground node coupled to ground potential and a floating node.

18. The TTL to ECL translator of claim 17 wherein said clamp bridge comprises first and second diode means coupled on either side of the floating node and third and fourth diode means coupled on either side of said ground node and wherein the diode junction area of the third and fourth diode means is smaller than the junction area of the first and second diode means for establishing translating signals in the negative voltage range and limiting said range.

19. The TTL to ECL translator of claim 18 wherein the third and fourth diode means comprise base collector shorted transistors.

* * * * *